(12) United States Patent
Rao et al.

(10) Patent No.: US 6,549,458 B1
(45) Date of Patent: Apr. 15, 2003

(54) NON-VOLATILE MEMORY ARRAY USING GATE BREAKDOWN STRUCTURES

(75) Inventors: Kameswara K. Rao, San Jose, CA (US); Martin L. Voogel, Los Altos, CA (US); James Karp, Saratoga, CA (US); Shahin Toutounchi, Pleasanton, CA (US); Michael J. Hart, Palo Alto, CA (US); Daniel Gitlin, Palo Alto, CA (US); Kevin T. Look, Fremont, CA (US); Jongheon Jeong, Campbell, CA (US); Radko G. Bankras, Enschede (NL)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/040,044

(22) Filed: Oct. 25, 2001

Related U.S. Application Data

(60) Division of application No. 09/553,571, filed on Apr. 19, 2000, now Pat. No. 6,522,582, which is a continuation-in-part of application No. 09/262,981, filed on Mar. 5, 1999, now Pat. No. 6,055,205.

(51) Int. Cl.[7] .......................... G11C 14/00; G11C 16/04
(52) U.S. Cl. ........................ 365/185.08; 365/185.14; 365/185.28
(58) Field of Search ..................... 365/185.08, 185.14, 365/185.23, 185.27, 185.28, 185.26

(56) References Cited

U.S. PATENT DOCUMENTS

| 3,618,053 | A | | 11/1971 | Hudson et al. |
| 3,699,544 | A | | 10/1972 | Joynson et al. |
| 4,689,504 | A | | 8/1987 | Raghunathan et al. |
| 4,739,191 | A | | 4/1988 | Puar |
| 5,375,086 | A | | 12/1994 | Wahlstrom |
| 5,515,319 | A | * | 5/1996 | Smayling et al. ...... 365/185.06 |

(List continued on next page.)

OTHER PUBLICATIONS

Ying Shi et al., "Polarity Dependent Gate Tunneling Currents in Dual–Gate CMOSFETs", IEEE Transactions on Electron Devices, vol. 45, No. 11, Nov. 1998, pp. 2355–2360.

(List continued on next page.)

Primary Examiner—David Nelms
Assistant Examiner—Thong Le
(74) Attorney, Agent, or Firm—T. Lester Wallace; Edel M. Young

(57) ABSTRACT

Memory cell structures and related circuitry for use in non-volatile memory devices can be fabricated utilizing standard CMOS processes, for example, 0.18 micron or 0.15 micron processes. Advantageously, the cell structures can be programmed so that a conductive path is formed between like type materials, for example, between a p-type gate and a p-type source/drain region or an n-type gate and an n-type source/drain region. Programming cells in this manner advantageously provides a programmed cell having a low, linear resistance after programming.

23 Claims, 11 Drawing Sheets

U.S. PATENT DOCUMENTS

| | | |
|---|---|---|
| 5,523,971 A | 6/1996 | Rao |
| 5,541,529 A | 7/1996 | Mashiko et al. |
| 5,563,842 A | 10/1996 | Challa |
| 5,604,693 A | 2/1997 | Merrit et al. |
| 5,680,360 A | 10/1997 | Pilling et al. |
| 5,790,448 A | 8/1998 | Merrit et al. |
| 5,796,656 A | 8/1998 | Kowshik et al. |
| 5,812,459 A | 9/1998 | Atsumi et al. |
| 5,812,476 A | 9/1998 | Segawa |
| 5,821,805 A | 10/1998 | Jinbo |
| 5,831,923 A | 11/1998 | Casper |
| 5,936,881 A | 8/1999 | Kawashima et al. |
| 5,959,885 A | 9/1999 | Rao |
| 5,986,916 A | 11/1999 | Merritt et al. |
| 5,999,425 A | 12/1999 | Lacey et al. |
| 6,023,188 A | 2/2000 | Lee et al. |
| 6,044,012 A | 3/2000 | Rao et al. |
| 6,055,205 A | 4/2000 | Rao et al. |
| 6,160,723 A * | 12/2000 | Liu ............................ 327/536 |
| 6,177,830 B1 | 1/2001 | Rao |
| 6,212,103 B1 * | 4/2001 | Ahrens et al. ......... 365/185.14 |
| 6,243,294 B1 | 6/2001 | Rao et al. |

OTHER PUBLICATIONS

Philippe Candelier et al., "One Time Programmable Drift Antifuse Cell Reliability", IEEE 38th Annual International Reliability Physics Symposium, San Jose, CA 2000, pp. 169–173.

Joo–Sun Choi et al., "Antifuse EPROM Circuit for Field Programmable DRAM", IEEE International Solid–State Circuits Conference 2000, Session 24, Paper 24, Paper WP 24.8, pp. 406–407 and 330–331.

* cited by examiner

NON-VOLATILE MEMORY ARRAY USING GATE BREAKDOWN STRUCTURES

PRIORITY PATENTS

This application claims priority to U.S. patent application Ser. No. 09/553,571 filed Apr. 19, 2000, now U.S. Pat. No. 6,522,582, which claims priority to U.S. patent application Ser. No. 09/262,981, filed on Mar. 5, 1999, now U.S. Pat. No. 6,055,205, both of which are incorporated by reference herein.

CROSS REFERENCE TO RELATED APPLICATIONS

This application relates to the following commonly owned applications:

U.S. patent application Ser. No. 09/552,280 filed Apr. 19, 2000;

U.S. patent application Ser. No. 09/552,625 filed Apr. 19, 2000, now issued as U.S. Pat. No. 6,243,294 B1; and U.S. patent application Ser. No. 09/524,971 filed Mar. 14, 2000.

These related applications are incorporated herein by reference.

TECHNICAL FIELD

This invention relates to integrated circuits, and more particularly to memory architectures including various cell structures and charge pumps for use in non-volatile memory arrays.

BACKGROUND OF THE INVENTION

Many integrated circuits now in use are fabricated in what is called CMOS (complimentary metal oxide semiconductor) technology, which forms both PMOS and NMOS transistors in a semiconductor substrate. The term "semiconductor substrate" is defined to mean any construction comprising semiconductor material, including, but not limited to, bulk semiconductor materials such as a semiconductor wafer (either alone or in assemblies comprising other material they are on), and semiconductor material layers (either alone or in assemblies comprising other materials). The term "substrate" refers to any supporting structure, including, but not limited to, the semiconductor substrates described above.

One of the main objectives of integrated circuit technology is to minimize transistor size. Typically, transistors are described in terms of their minimum feature dimension. Current technology provides a minimum feature size of 0.35 micron or less. The minimum feature size, which is also referred to as a "line width", refers to the minimum width of a transistor feature such as the gate width, or the separation between source and drain diffusion regions. Typically, 0.35-micron technology is used to form CMOS transistors having gate oxide thicknesses of around 70 Angstrom. A 0.18-micron technology is used to form CMOS transistors having a gate oxide thickness of around 35–40 Angstrom. A 0.15-micron technology is used to form CMOS transistors having a gate oxide thickness of around 25–30 Angstrom. The gate "oxide" is typically an oxide dielectric layer that is interposed between the conducting gate electrode, which is typically a polycrystalline silicon structure formed overlying the principle surface of a substrate in which the integrated circuit is formed, and the underlying substrate which typically is the channel portion of the transistor extending between the source and the drain regions. Transistors formed using the 0.35-micron technology typically operate at a voltage of 3.3 Volts. Transistors formed using the 0.18-micron technology typically operate at a voltage of 1.8 Volts. Greater voltages are likely to destroy the transistor by rupturing the gate oxide.

In the field of data storage, there are two main types of storage elements. The first type of storage element is a volatile storage element such as typically used in DRAM (dynamic random access memory) or SRAM (static random access memory) in which the information stored in a particular storage element is lost when power is removed from the circuit. The second type of storage element is a non-volatile storage element in which the information is preserved even if power is removed. Typically, the types of elements used to provide non-volatile storage are substantially different from those used in ordinary logic circuitry or in volatile storage, thereby requiring different fabrication techniques. It has heretofore not been possible to include non-volatile storage on an integrated circuit chip formed exclusively using standard CMOS processes.

SUMMARY

Memory architectures including various cell structures for use in non-volatile memory arrays and methods of programming memory cells are described. In the described embodiments, the cell structures can be fabricated utilizing standard CMOS processes, e.g. sub 0.35 micron or sub 0.25 micron processes. Preferably, the cell structures are fabricated using 0.18 micron or 0.15 micron standard CMOS processes. This enables the transistors that are utilized for both the storage transistors and the pass transistors (I/O transistors) to be formed using standard CMOS processing techniques.

Advantageously, the cell structures that are formed can be programmed so that a conductive path is formed between like type materials. For example, in certain cell structures a cell is programmed by applying a programming voltage in such a way as to form a conductive path between a p-type gate and a p-type source/drain region or an n-type gate and an n-type source/drain region. Programming cells in this manner advantageously provides a programmed cell having a low, linear resistance after programming.

In particular embodiments, the cell structures are fabricated utilizing standard 0.18 micron or 0.15 micron CMOS processes. In these embodiments, memory cells are fabricated comprising storage structures, including transistors, having different gate breakdown characteristics, e.g. as impacted by the thicknesses of their gate dielectric layers. The memory cells are programmed by taking advantage of the different gate breakdown characteristics of the different memory cells.

In one embodiment, a method of programming a non-volatile memory cell comprises providing a storage transistor over a substrate. The storage transistor comprises a gate and a pair of source/drain regions that are formed within the substrate. A programming voltage is applied to the storage transistor sufficient to form a conductive path between the gate and one of the pair of source/drain regions.

In another embodiment, a method of programming a non-volatile memory cell comprises providing a storage structure over a substrate. The storage structure comprises a gate at least a portion of which is disposed proximate a region of the substrate. The gate and the substrate region comprise the same type material. A programming voltage is applied to the storage structure sufficient to form a conductive path between the gate and the substrate region.

In yet another embodiment, a non-volatile memory cell comprises a substrate and a low voltage CMOS storage transistor supported by the substrate. The storage transistor comprises a gate, a gate dielectric, and a pair of source/drain regions received within the substrate. The memory cell is configured for programming by rupturing the gate dielectric of the storage transistor. The memory cell also comprises a high voltage p-channel transistor having a pair of source/drain regions. One of the pair of source/drain regions of the p-channel transistor is coupled with one of the pair of source/drain regions of the CMOS storage transistor. The storage transistor is configured for programming through the p-channel transistor.

In yet another embodiment, a non-volatile memory cell comprises a substrate and a low voltage p-channel storage transistor supported by the substrate. The storage transistor comprises a gate, a gate dielectric, and a pair of source/drain regions received within a well in the substrate. The memory cell is configured for programming by rupturing the gate dielectric of the storage transistor. The memory cell also comprises a high voltage p-channel transistor having a pair of source/drain regions. One of the pair of source/drain regions of the high voltage p-channel transistor is coupled with the gate of the low voltage p-channel storage transistor. The storage transistor is configured for programming through the high voltage p-channel transistor. In a further embodiment, a field programmable gate array (FPGA) comprises a substrate, a plurality of word lines supported by the substrate, a plurality of bit lines supported by the substrate, and a plurality of memory cells supported by the substrate. Each memory cell comprises a low voltage CMOS storage transistor that comprises a gate, a gate dielectric, and a pair of source/drain regions received within the substrate. The memory cell is configured for programming by rupturing the gate dielectric of the storage transistor. The memory cell also comprises a high voltage p-channel transistor having a gate and a pair of source/drain regions. One of the pair of source/drain regions of the p-channel transistor is coupled with one of the pair of source/drain regions of the CMOS storage transistor. The other of the pair of source/drain regions of the p-channel transistor is coupled with one of the plurality of bit lines. The gate of the p-channel transistor is coupled with one of the plurality of word lines. The storage transistor is configured for programming through the p-channel transistor.

In another embodiment, a field programmable gate array (FPGA) comprises a substrate, a plurality of word lines supported by the substrate, a plurality of bit lines supported by the substrate, and a plurality of memory cells supported by the substrate. Each memory cell comprises a low voltage p-channel storage transistor that comprises a gate, a gate dielectric, and a pair of source/drain regions received within a well in the substrate. The memory cell is configured for programming by rupturing the gate dielectric of the storage transistor. The memory cell also comprises a high voltage p-channel transistor comprising a gate and a pair of source/drain regions. One of the pair of source/drain regions of the high voltage p-channel transistor is coupled with the gate of the low voltage p-channel storage transistor. The other of the pair of source/drain regions of the high voltage p-channel transistor is coupled to one of the plurality of bit lines. The gate of the high voltage p-channel transistor is coupled to one of the plurality of word lines and the storage transistor is configured for programming through the high voltage p-channel transistor.

In still a further embodiment, a field programmable gate array (FPGA) comprises a substrate, a plurality of word lines supported by the substrate, a plurality of bit lines supported by the substrate, and a plurality of memory cells supported by the substrate. Each memory cell comprises a gate, a substrate region, and a dielectric material disposed between the gate and the substrate region. The gate is disposed over the substrate region, and both the gate and the substrate region comprise the same type material. The dielectric material is configured to breakdown in the presence of a specific programming configuration so that a conductive path is formed between the gate and the substrate region thereby programming the memory cell.

In other embodiments, charge pumps are fabricated using the same standard CMOS processing techniques that are used to form the memory cells. This advantageously enables an on-chip charge pump to provide the necessary programming voltage and current so that the cell can be programmed.

In one charge pump embodiment, a charge pump comprises a semiconductor substrate, a plurality of diodes supported by the substrate, and a plurality of high voltage CMOS transistors each of which having source/drain regions and a gate. The diodes are connected to form a path between a voltage supply node and a programming voltage node. The source/drain regions of at least some of the transistors are commonly coupled at different locations along the path defined by the diodes. At least some of the gates are individually coupled to one of two clock signal lines. In one aspect, the charge pump comprises a portion of a non-volatile memory device that includes a non-volatile memory array programming by the programming voltage that is developed by the charge pump.

In another charge pump embodiment, a charge pump circuit comprises a semiconductor substrate, a pair of clock signal lines supported by the substrate, a plurality of diodes supported by the substrate, a first plurality of p-channel transistors each of which having source/drain regions and a gate, and a second plurality of p-channel transistors each of which having source/drain regions and a gate. The diodes are connected to form a path between a voltage supply node and a programming voltage node that provides a programming voltage. The source/drain regions of the first plurality of transistors are commonly coupled at different locations along the path defined by the diodes, and the gates are coupled to one of the pair of clock signal lines. The source/drain regions of the second plurality of transistors are commonly coupled at different other locations along the path defined by the diodes, and the gates are coupled to the other of the pair of clock signal lines.

DETAILED DESCRIPTION OF THE DRAWINGS

Overview

The various embodiments described just below provide memory structures, including memory cell structures, memory arrays and charge pumps, that greatly facilitate the manner in which non-volatile memory circuits can be programmed and read. The various embodiments form conductive paths between structures of the same conductivity type (n-type to n-type or p-type to p-type), and thus provide generally linear, low resistance devices that provide advantageous distances between so-called "on" and "off" resistances that, in turn, provide improved reliability windows for determining whether the devices are on or off. In the described embodiments, the various cell structures can be fabricated utilizing standard CMOS processes, e.g. sub 0.35 or sub 0.25 micron processes. This allows standard-dimensioned gate dielectrics to be utilized in the cell structures. This, in turn, provides great flexibility and convenience over other approaches that require specialized processing to form memory devices. The cell structures of the preferred embodiments can be fabricated using 0.18 micron or 0.15 micron standard CMOS processes. Advantageously, the cell structures that are formed are programmed so that a conductive path is formed between and includes like type materials. For example, in certain cell structures a cell is programmed by applying a programming voltage in such a way as to form a conductive path between a p-type gate and a p-type source/drain region. Similarly, in certain cell structures a cell is programmed by applying a programming voltage in such a way as to form a conductive path between an n-type gate and an n-type source/drain region. Programming cells in this manner advantageously provides a programmed cell having a low, linear resistance after programming. This greatly improves the readability of the cell.

Other advantages are achieved, in some embodiments, through the provision of an on-chip charge pump that can be utilized to provide the programming voltage and current that is necessary to program the memory cells. Although an on-chip charge pump is not necessary, it further enhances the flexibility and convenience of the overall memory system.

Figure 1:
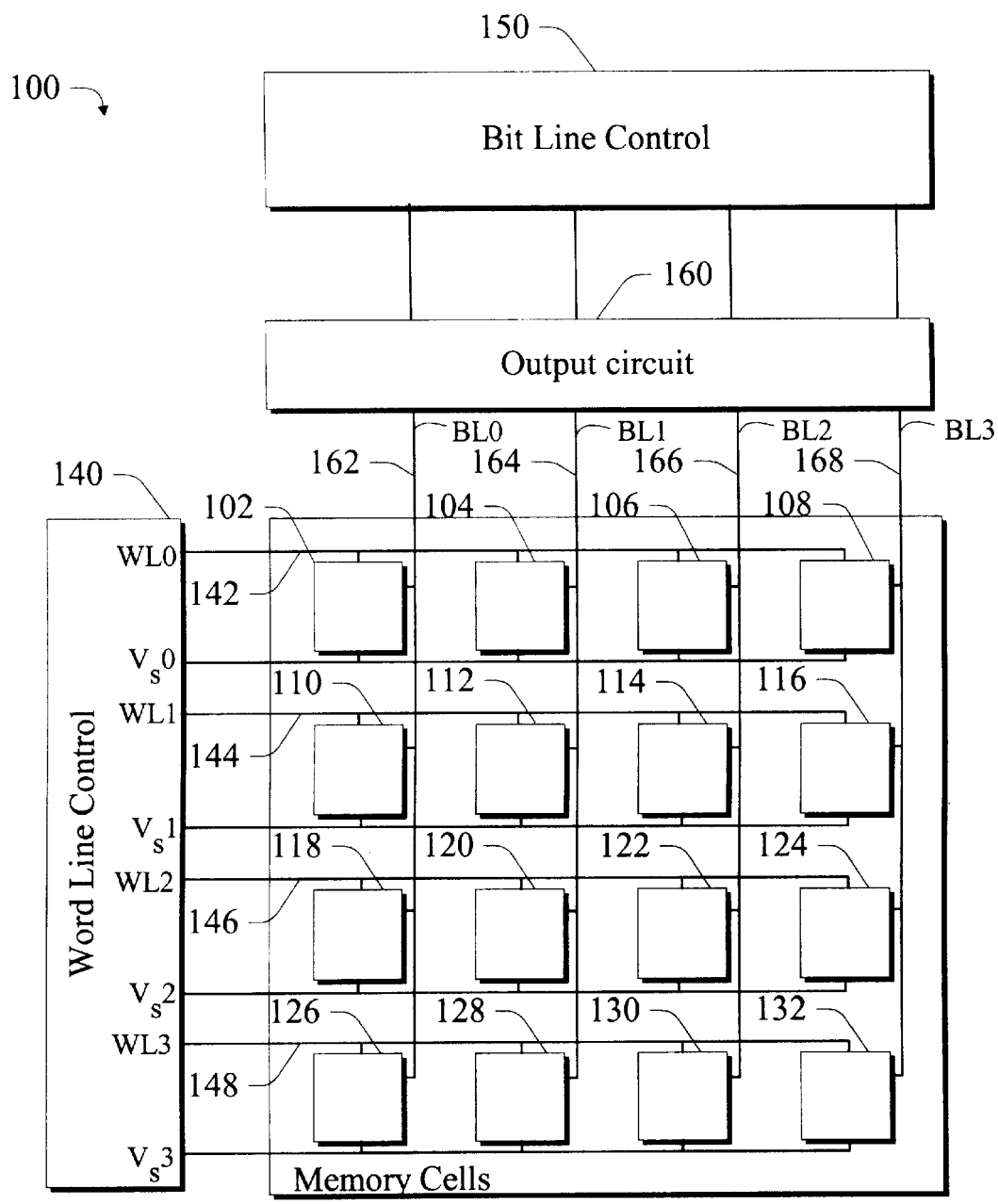
FIG. 1 is a schematic diagram of an exemplary memory system in which various inventive memory cell structures can be employed.

FIG. 1 is a schematic diagram of a memory system 100 in accordance with one embodiment. Memory system 100 is typically located and formed on a substrate, such as a semiconductor substrate, that provides an integrated circuit chip. An exemplary semiconductor substrate is a bulk monocrystalline silicon substrate. Memory system 100 also typically is accompanied with other circuitry which is not specifically shown in FIG. 1. This circuitry can include, without limitation, circuitry relating to field programmable gate arrays (FPGAs). In the illustrated example, memory system can be fabricated in accordance with known sub 0.35-micron or sub 0.25 micron techniques. More preferably, the memory system is fabricated in accordance with known 0.18 micron techniques and, even more preferably, 0.15 micron techniques. The CMOS techniques that can be employed to form the described embodiments are desirably standard CMOS processing techniques. This constitutes a noteworthy advancement over past approaches which have required specialized, non-standard CMOS techniques to fabricate non-volatile memory systems. For additional details on the memory system 100 of FIG. 1, see U.S. Pat. No. 6,243,294 B1 entitled "Improved Array Arrangement for Non-Volatile Memory Using Gate Breakdown Structure in Standard Sub 0.25 Micron CMOS Process", by Rao et al., (the subject matter of which is incorporated herein by reference.)

In the embodiments that are described just below, memory system 100 is fabricated on an integrated circuit chip in accordance with known CMOS processes. Although the embodiments are described in this context, the techniques or processes through which the inventive memory cells are formed are not intended to limit the scope of the claims below. Accordingly, other current or future processing techniques, e.g. CMOS processing techniques, can be utilized without departing from the spirit and scope of the claimed subject matter.

In the described embodiments, two different types of transistors are fabricated or formed by standard CMOS processes. A first of the transistors will be referred to herein as a "low voltage CMOS transistor," and a second of the transistors will be referred to herein as a "high voltage CMOS transistor." A characteristic of the low voltage CMOS transistor is that it typically has a thinner gate dielectric layer than the high voltage CMOS transistor. In the 0.18-micron embodiments, low voltage CMOS transistors typically have a gate dielectric (i.e. oxide) layer thickness from between around 35–40 Angstrom and are designed to operate in response to a nominal supply voltage of 1.8 Volts. The high voltage CMOS transistors, on the other hand, typically have a gate dielectric (i.e. oxide) layer thickness from between around 65–80 Angstrom and are designed to operate in response to a nominal supply voltage of 3.3 Volts. In the 0.15 micron embodiments, low voltage CMOS transistors typically have a gate dielectric layer thickness from between 25–30 Angstrom. The high voltage CMOS transistors, on the other hand, typically have a gate dielectric layer thickness from between around 65–80 Angstrom. The high voltage CMOS transistors are typically used in the input/output (I/O) circuitry of the integrated circuit chip. The I/O circuitry provides an interface between the low voltage CMOS transistors, which form the core of the integrated circuit chip, and an external 3.3 Volt bus. One important advantage of the embodiments described below is that the memory cells can be formed using standard CMOS processing techniques to form the I/O transistors that are utilized to transfer the programming voltage to program the memory cell. This greatly simplifies fabrication of the devices because standard techniques can be used.

In the illustrated example, memory system 100 includes a 4×4 array of memory cells 102–132, word line control circuitry 140, bit line control circuitry 150, and output circuitry 160. Although the illustrated example is in the context of a 4×4 array, it should be understood that arrays having other dimensions can be constructed in accordance with the teachings presented herein.

Each of the illustrated memory cells 102–132 includes a storage structure of some type, and an access structure of some type that allows access to the storage structure. The storage structures are utilized to program the memory cells, and the access structures are utilized to access the storage structures. Programming and reading typically occurs through the access structures. Each access structure can comprise one or more transistors. For example, one transistor can be provided for programming the storage structure, while another transistor is provided for reading the memory cell. Alternately, programming and reading can take place through one transistor. Examples of both types of construction are provided in the application Ser. No. 09/262,981, incorporated by reference above.

Word line control circuitry 140 includes a plurality of word lines 142–148 that extend through and connect with individual memory cells of the memory array. In the illustrated example, word line 142 is operably connected with memory cells 102, 104, 106, and 108. Word line 144 is operably connected with memory cells 110, 112, 114, and 116. Word line 146 is operably connected with memory cells 118, 120, 122, and 124. Word line 148 is operably connected with memory cells 126, 128, 130, and 132.

Bit line control circuitry 150 is operably connected with bit lines 162–168 through output circuitry 160. Each of the bit lines extends through and connects with individual memory cells of the memory array. In the illustrated example, bit line 162 is operably connected with memory cells 102, 110, 118, and 126. Bit line 164 is operably connected with memory cells 104, 112, 120, and 128. Bit line 166 is operably connected with memory cells 106, 114, 122, and 130. Bit line 168 is operably connected with memory cells 108, 116, 124, and 132.

Access to the individual memory cells occurs through utilization of the word lines and bit lines. When memory cells are programmed, they are accessed and programmed though the word and bit lines. When memory cells are read, they are accessed and read through the word and bit lines and through the use of output circuit 160. Some specific examples of how this operation occurs are described in U.S. patent application Ser. No. 09/262,981.

In the illustrated example, when a storage structure is programmed, a programming voltage is applied to it in such a way as to cause the gate dielectric layer to break down. When this happens, a conductive path is formed between the gate and another region of the storage structure. One challenge to programming storage structures is to do it in such a way so that access structures are undamaged. For example, if both the access structures and storage structures comprise the same types of devices having the same operating characteristics and features, accessing the storage structures through the access structures for programming purposes would most likely damage the access structures. The disclosure of application Ser. No. 09/262,981 addresses this problem by using low voltage CMOS transistors for the storage transistors, and high voltage CMOS transistors as the write access transistors. There, the low voltage CMOS transistors are programmed by destroying their gate dielectric layers through the high voltage CMOS transistors.

Introduction to the Storage Structure Embodiments

In accordance with the embodiments described below, various new programming methods and cell structures are described. These cell structures can be programmed through the use of circuitry that is the same as or similar to that described in application Ser. No. 09/262,981. To this extent, such specific circuitry is not further described in detail and should be apparent to one of skill in the art after studying that disclosure.

In the embodiments about to be described, advantages are achieved over other approaches in that programmed memory structures have a generally linear, low resistance (e.g. 400 Ohm at 1.8 Volts—which is typically, as of this date, the maximum voltage used in deep sub-micron CMOS). These advantages are achieved, in some embodiments, through programming methods that program the storage structure so that a conductive path exists between the storage structure's gate (either n- or p-type) and a similar type substrate region thereby providing a programmed resistive structure that provides the desired linearity. In other embodiments, the storage structure is programmed by forming a conductive path between the storage structure's gate and one of its source/drain regions (i.e. in the event the storage structure comprises a CMOS transistor). These programmed storage structures are preferably formed through the use of conventional known CMOS processing techniques that do not require the use of any specialized processing techniques. This enables the transistors that comprise the memory structures to be formed to have standard gate dielectric layer thicknesses. The specialized processing techniques that have been used in the past are directed to forming transistors that have gate dielectric thicknesses that were not achievable using conventional CMOS processing techniques. Thus, in the preferred embodiments, memory structures can be formed using conventional sub 0.35 micron, sub 0.25 micron, 0.18 micron and 0.15 micron processing techniques.

Programming of these storage structures can be achieved, in preferred embodiments, through the use of inventive on-chip charge pumps that are described below in more detail. These on-chip charge pumps are advantageously formed through the use of the same conventional known CMOS processing techniques that are utilized to form the various cell structures. This provides for a generally self-contained memory device.

First Storage Structure Embodiment

Figure 2:
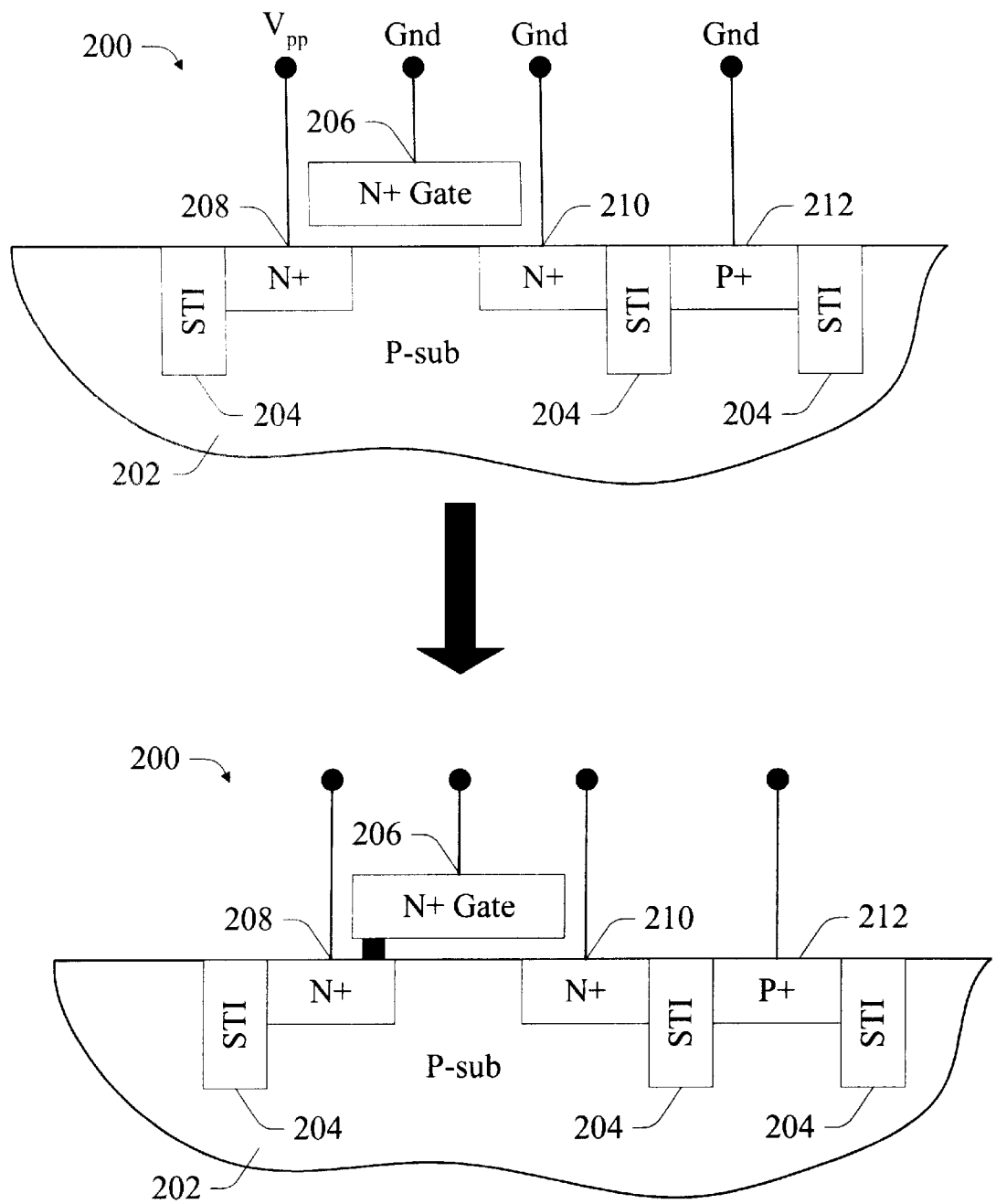
FIG. 2 is a diagrammatic side sectional view of a storage structure in accordance with one embodiment of the present invention.

FIG. 2 shows a storage structure in accordance with one embodiment generally at 200. This storage structure is preferably programmed to form a conductive link between similar type materials as will be described below. This, in turn, provides a low post-programming resistance which approximates a linear stable resistor. Programming the storage structure in this manner avoids any of the non-linearity issues that were previously associated with programmed cells having a conductive link between different types of materials, e.g. p-type and n-type.

A substrate 202 (which, in this example comprises a p-type substrate) comprises a plurality of shallow trench isolation regions 204 formed therein through conventional techniques. A pair of source/drain regions 208, 210 are formed within substrate 202 and a gate 206 is provided operably proximate the source/drain regions 208, 210. In this example, a portion of the gate 206 is disposed over each of the source/drain regions 208, 210. A gate dielectric (e.g. gate oxide) is formed intermediate gate 206 and a surface of substrate 202. A contact 212 to the substrate is provide in the form of a p-type region. In the illustrated example, the storage structure comprises a low voltage n-channel transistor that is formed through conventional CMOS processing techniques. The n-channel transistor has an n-type gate and n-type source/drain regions. In the described embodiment, the CMOS techniques can comprise sub 0.35 micron or sub 0.25 micron processing techniques. In more preferred embodiments, these techniques comprise 0.18 micron techniques and, even more preferably, 0.15 micron techniques. Accordingly, the storage transistor has a gate dielectric layer thickness as described above.

The storage structure is programmed by destroying the gate dielectric layer so that a conductive path is formed between the storage structure's gate and a substrate region. The selected biasing scheme is advantageous in that it forces a conductive path to be formed from the gate to the drain, instead of from the gate to the substrate. This ensures that the conductive path is formed between similar type materials so that the resultant programmed structure has linear characteristics like those of a resistor. Specifically, the programmed cell has a post-programming resistance that is low in comparison to devices in which the programmed conductive path is formed between different type materials. In the illustrated example, a programming voltage $V_{pp}$ is applied to the storage transistor sufficient to form a conductive path between the gate 206 and one of the pair of source/drain regions 208, 210. In the described embodiments, the programming voltage $V_{pp}$ is around 8 volts, but can be higher, i.e. 9 volts. In this particular example, the conductive path that is formed extends between the gate 206 and source/drain region 208 (as illustrated by the black path that exists in the lowermost of the substrate portions in FIG. 2). The conductive path that is formed in this example, is formed as a result of applying the programming voltage to one of the source/drain regions (here, drain 208), while maintaining the gate 206, source/drain region 210, and substrate 202 (through region 212) at a potential that is different from the programming voltage. Here, the gate, source/drain region 210 and substrate are maintained at ground while the programming voltage is applied to only one of the source/drain regions.

Figure 3:
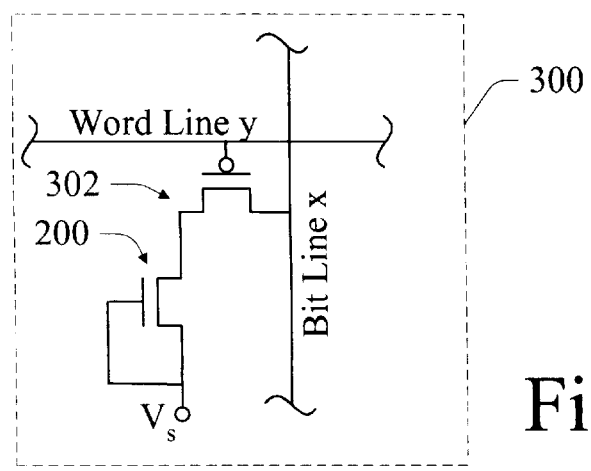
FIG. 3 is a schematic diagram of an exemplary memory cell structure in accordance with one embodiment of the present invention.

FIG. 3 shows an exemplary memory cell 300 that incorporates the storage structure 200 of FIG. 2. Memory cell 300 can be incorporated in the memory system 100 of FIG. 1. When so incorporated, memory cell 300 comprises each of the individual memory cells 102–132.

Memory cell 300 comprises a low voltage CMOS storage transistor in the form of n-channel transistor 200. A high voltage p-channel transistor 302 is provided and has a pair of source/drain regions. The storage transistor is programmed through the p-channel transistor 302.

In the illustrated example, the p-channel transistor has a gate dielectric layer thickness of around 70 Angstrom, a channel width of around 1 micron, and a channel length of around 0.6 micron. The well of the p-channel transistor 302 is coupled to receive programming voltage $V_{pp}$. One of the pair of source/drain regions of p-channel transistor 302 is coupled with one of the pair of source/drain regions (i.e. source/drain region 208 in FIG. 2) of storage transistor 200.

The other of the pair of source/drain regions of the p-channel transistor 302 is coupled with bit line x, where x represents any of the bit lines 162–168 in FIG. 1. The gate and source of the storage transistor 200 are coupled to a voltage line $V_s$. The gate of the p-channel transistor 302 is coupled with word line y, where y represents any of the word lines 142–148 in FIG. 1. In this example, the storage transistor 200 is also read through the p-channel transistor 302. The illustrated memory cell arrangement works well for both long channel and short channel devices. In long channel devices, the programming current before breakdown goes to the source at low voltages and to the gate at high voltages. At breakdown, all of the current goes to the gate. In the post breakdown read operation, the resistance is 2 orders of magnitude less than the resistance that is described in application Ser. No. 09/262,981. This is because a short is being established between an n-poly gate and an n+ diffusion region and the current goes from drain to gate. The programming bias forces a conductive path to be formed in a particular location between similar type materials. This is advantageous because it avoids having the conductive path formed between different type materials which would provide a pn junction having non-linear characteristics.

In this example, all deselected word lines are at $V_{pp}$ and $V_{pp}$ is applied to the gates of the thick oxide p-channel devices. The wells of these devices are at $V_{pp}$. The voltage is not large enough for tunneling across the gate oxide. If the deselected bit is programmed previously, the p-channel source is at ground, the well is at $V_{pp}$ and the gate is at $V_{pp}$. Under these conditions there is a leakage from the well to the source, which is at ground. This is avoided by applying a source voltage $V_s$ on all the rows. The source voltage is 0 volts for the selected row and is 3.3 volts for the deselected rows. This is described in more detail in U.S. patent application Ser. No. 09/552,625 entitled "Memory Architecture for Non-volatile Storage Using Gate Breakdown Structure in Standard sub 0.35 Micron Process," issued Jun. 5, 2001 as U.S. Pat. No. 6,243,294. That application was filed on that same date as this application and is assigned to the assignee of this application, the disclosure of which is incorporated by reference herein. The table set forth immediately below describes characteristics of the program and read modes for memory cell 300 when it is incorporated in a FPGA that is formed in accordance with 0.18 micron CMOS techniques.

|  | Addressed Row | Non-addressed Row | Addressed Column | Non-addressed column |
|---|---|---|---|---|
| Program Mode | 3.3 V | $V_{pp}$ | $V_{pp}$ | 3.3 V or float |
| Read Mode | 0 | 3.3 V | Connected to output buffer | Float |

Second Storage Structure Embodiment

Figure 4:
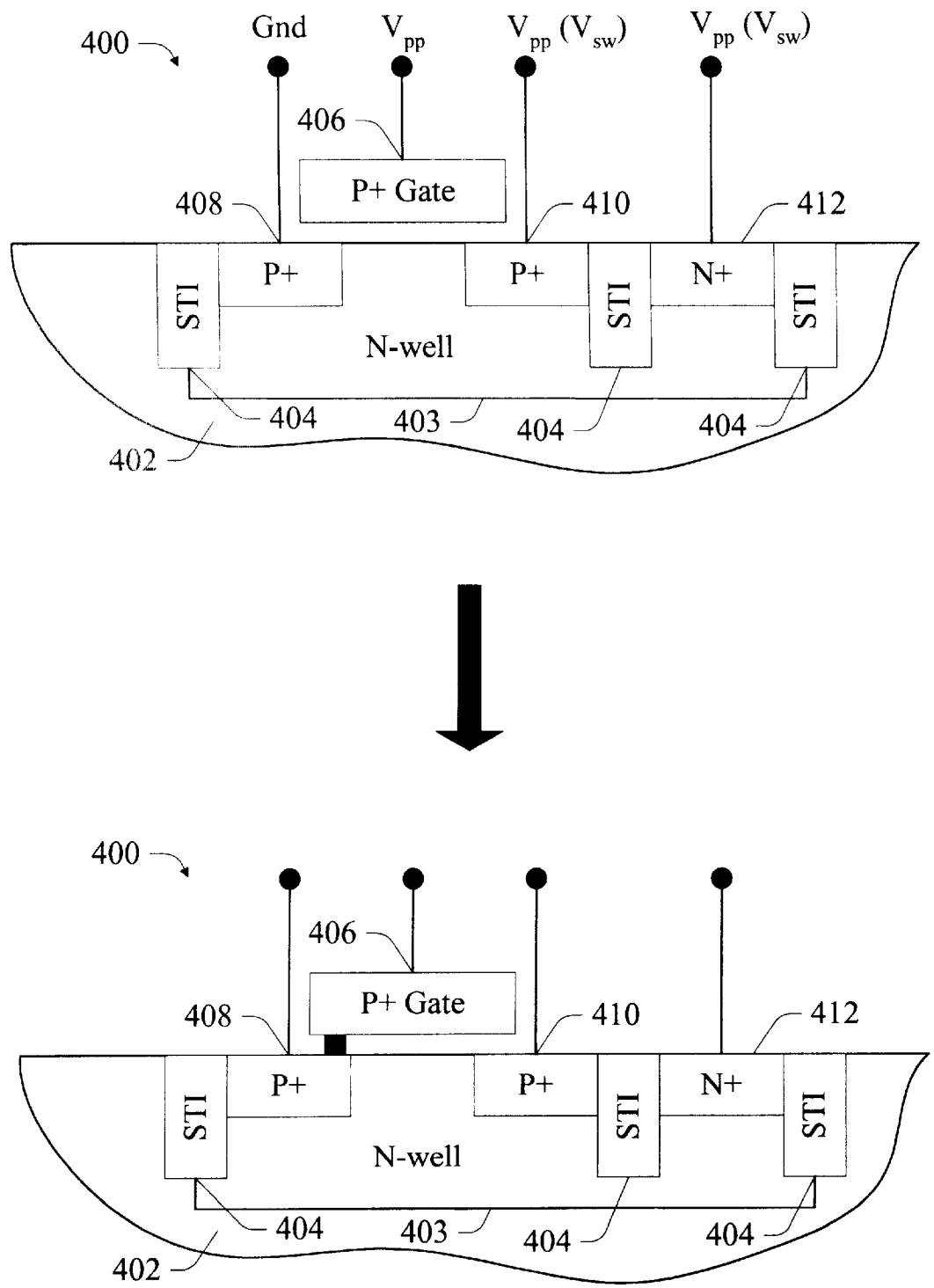
FIG. 4 is a diagrammatic side sectional view of a storage structure in accordance with one embodiment of the present invention.

FIG. 4 shows a storage structure in accordance with another embodiment generally at 400. This storage structure is preferably programmed to form a conductive link between similar type materials as will be described below. This, in turn, provides a low post-programming resistance which approximates a linear stable resistor. Programming the storage structure in this manner avoids any of the non-linearity issues that were previously associated with programmed cells having a conductive link between different types of materials, e.g. p-type and n-type.

A substrate 402 (which, in this example comprises a p-type substrate) has an n-well 403 formed therein. A plurality of shallow trench isolation regions 404 are formed within the substrate through conventional techniques. A pair of source/drain regions 408, 410 are formed within substrate 402 and a gate 406 is provided operably proximate the source/drain regions 408, 410. In this example, a portion of the gate 406 is disposed over each of the source/drain regions 408, 410. A gate dielectric (e.g. gate oxide) is formed intermediate gate 406 and a surface of substrate 402. A contact 412 to the substrate is provided in the form of an n-type region. In the illustrated example, the storage structure comprises a low voltage p-channel transistor that is formed through conventional CMOS processing techniques. The p-channel transistor has a p-type gate 406 and p-type source/drain regions 408, 410. In the described embodiment, these CMOS techniques comprise sub 0.35 micron or sub 0.25 micron processing techniques. In more preferred embodiments, these techniques comprise 0.18 micron techniques and, even more preferably 0.15 micron techniques. Accordingly, the storage transistor has a gate dielectric layer thickness as described above.

In one aspect, the storage structure is programmed by destroying the gate dielectric layer so that a conductive path is formed between the storage structure's gate and a substrate region. In the illustrated example, a programming voltage $V_{pp}$ is applied to the storage transistor sufficient to form a conductive path between the gate 406 and one of the pair of source/drain regions 408, 410. In this particular example, the conductive path that is formed extends between the gate 406 and source/drain region 408 (as illustrated by the black path that exists in the lowermost of the substrate portions in FIG. 4). The conductive path that is formed in this example, is formed as a result of applying the programming voltage to the gate 406 and only one of the source/drain regions (here, source 410). The substrate is also maintained at the programming voltage $V_{pp}$. The other of the source/drain regions (here drain 408) is maintained at a potential that is different, e.g. ground, from the programming voltage $V_{pp}$. An exemplary construction that is utilized in an exemplary memory cell is discussed below in connection with FIG. 5.

In another aspect, the storage structure is programmed by applying the programming voltage $V_{pp}$ on the gate 406, while grounding both of the source/drain regions 408/410 and well 403. Here, the programming is done in accumulation and the programming current before breakdown goes to the well. In the post breakdown read operation, the resistance is higher than the corresponding n-channel device.

In another aspect, the storage structure is programmed by applying the programming voltage $V_{pp}$ to the gate and grounding one of the source/drain regions (here, drain 408). The other of the source/drain regions (here, source 410) and the well 403 are maintained at a potential $V_{sw}$ that is greater than zero and less than the programming voltage $V_{pp}$.

Figure 5:
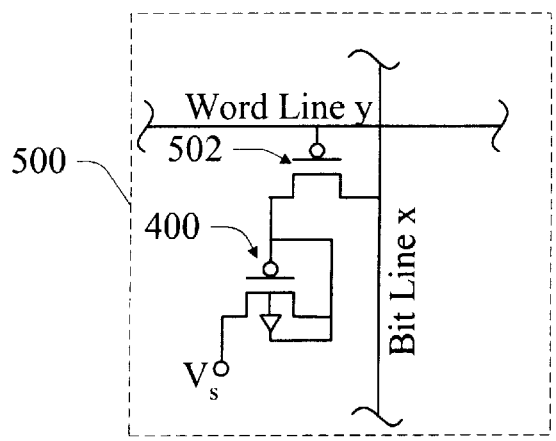
FIG. 5 is a schematic diagram of an exemplary memory cell structure in accordance with one embodiment of the present invention.

FIG. 5 shows an exemplary memory cell 500 that incorporates the storage structure 400 of FIG. 4. Memory cell 500 can be incorporated in the memory system 100 of FIG. 1. When so incorporated, memory cell 500 comprises each of the individual memory cells 102–132.

Memory cell 500 comprises a low voltage CMOS storage transistor in the form of p-channel transistor 400. A high voltage p-channel transistor 502 is provided and has a pair of source/drain regions. The storage transistor is programmed through the p-channel transistor 502.

In the illustrated example, the p-channel transistor 502 has a gate dielectric layer thickness of around 70 Angstrom, a channel width of around 1 micron, and a channel length of around 0.6 micron. The well of the p-channel transistor 502 is coupled to receive a programming voltage $V_{pp}$. One of the pair of source/drain regions of p-channel transistor 502 is coupled with the gate of storage transistor 400. The other of the pair of source/drain regions of the p-channel transistor is coupled with bit line x, where x represents any of the bit lines 162–168 in FIG. 1. The gate of the p-channel transistor 502 is coupled with word line y, where y represents any of the word lines 142–148 in FIG. 1. In this example, the storage transistor 400 is also read through the p-channel transistor 502. In this particular example, the source and substrate of storage transistor 400 are tied to the gate and the drain is grounded.

The table set forth immediately below describes characteristics of the program and read modes for memory cell 500 when it is incorporated in a FPGA that is formed in accordance with 0.18 micron CMOS techniques.

|  | Addressed Row | Non-addressed Row | Addressed Column | Non-addressed column |
|---|---|---|---|---|
| Program Mode | 3.3 V | $V_{pp}$ | $V_{pp}$ | 3.3 V or float |
| Read Mode | 0 | 3.3 V | Connected to output buffer | float |

Figure 6:
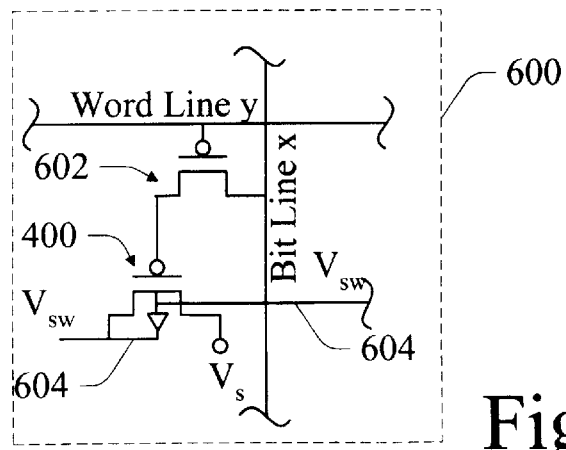
FIG. 6 is a schematic diagram of an exemplary memory cell structure in accordance with one embodiment of the present invention.

FIG. 6 shows an exemplary memory cell 600 that incorporates the storage structure of FIG. 4. Memory cell 600 can be incorporated in the memory system 100 of FIG. 1. When so incorporated, memory cell 600 comprises each of the individual memory cells 102–132.

Memory cell 600 comprises a low voltage CMOS storage transistor in the form of p-channel transistor 400. A high voltage p-channel transistor 602 is provided and has a pair of source/drain regions. The storage transistor is programmed through the p-channel transistor 602.

In the illustrated example, the p-channel transistor 602 has a gate dielectric layer thickness of around 70 Angstrom, a channel width of around 1 micron, and a channel length of around 0.6 micron. The well of the p-channel transistor 602 is coupled to receive a programming voltage $V_{pp}$. One of the pair of source/drain regions of p-channel transistor 602 is coupled with the gate of storage transistor 400. The other of the pair of source/drain regions of the p-channel transistor is coupled with bit line x, where x represents any of the bit lines 162–168 in FIG. 1. The gate of the p-channel transistor 602 is coupled with word line y, where y represents any of the word lines 142–148 in FIG. 1. In this example, the storage transistor 400 is also read through the p-channel transistor 602. In this particular example, an additional voltage programming line 604 is coupled with the well of the storage transistor and one of its source/drain regions. The additional programming line 604 enables a potential $V_{sw}$ to be applied to the source/drain region and well during programming. The other of the source/drain regions of the storage transistor 400 is coupled to ground. Here, $V_{sw}$ is greater than zero and less than $V_{pp}$. Preferably, $V_{sw}=V_{pp}-2$ V. In this arrangement, the programming is shifted towards the source side.

Third Storage Structure Embodiment

Figure 7:
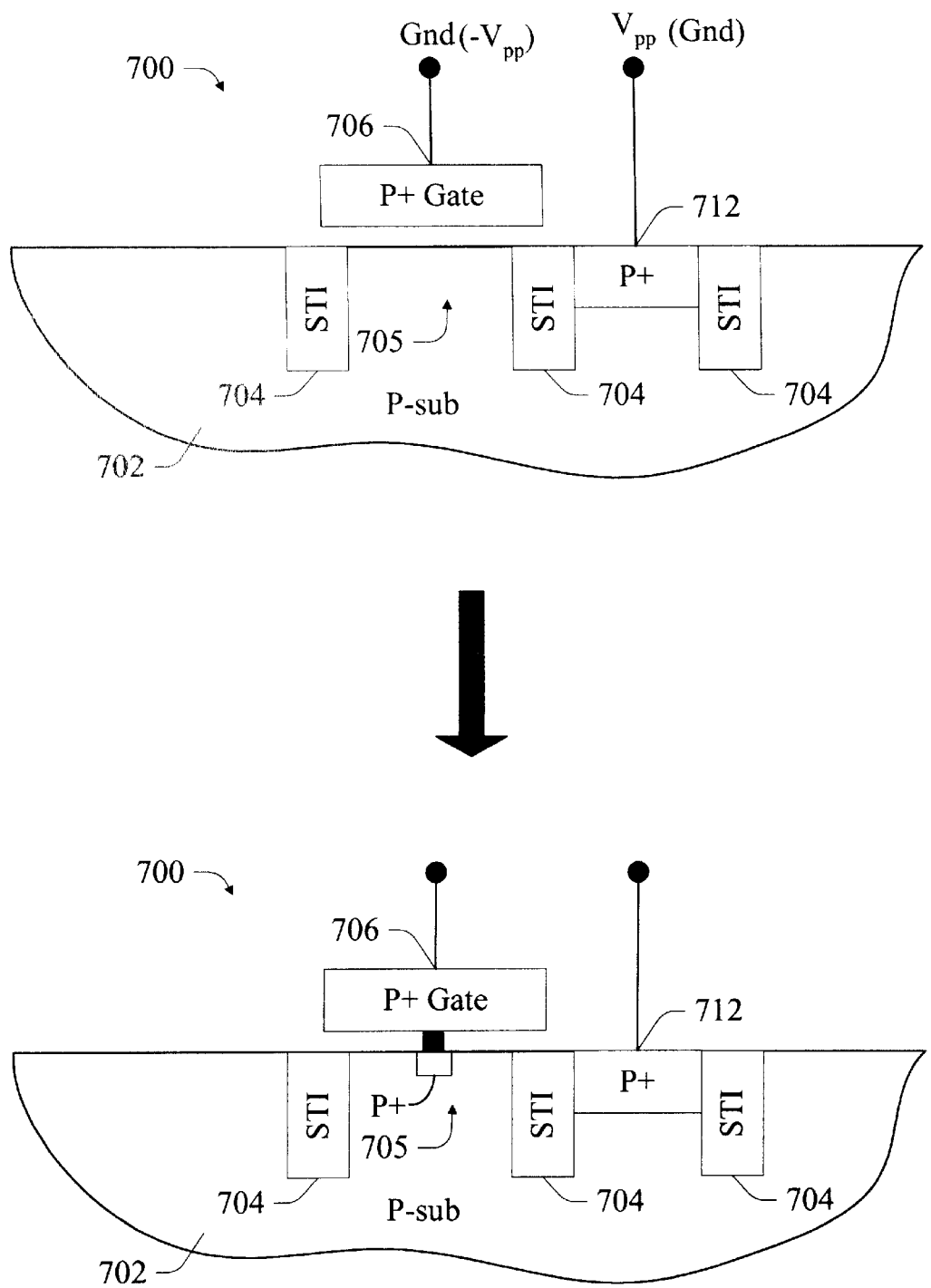
FIG. 7 is a diagrammatic side sectional view of a storage structure in accordance with one embodiment of the present invention.

FIG. 7 shows a storage structure in accordance with one embodiment generally at 700. This storage structure is preferably programmed to form a conductive link between similar type materials as will be described below. This, in turn, provides a low post-programming resistance which approximates a linear stable resistor. Programming the storage structure in this manner avoids any of the non-linearity issues that were previously associated with programmed cells having a conductive link between different types of materials, e.g. p-type and n-type.

A substrate 702 (which, in this example comprises a p-type substrate) comprises a plurality of shallow trench isolation regions 704 formed therein through conventional techniques. A region 705 is provided proximate which a gate 706 is disposed. In this example, a portion of the gate 706 is disposed over substrate region 705. A gate dielectric (e.g. gate oxide) is formed intermediate gate 706 and a surface of substrate region 705. A contact 712 to the substrate is provided in the form of a p-type region. In the illustrated example, the storage structure comprises a low voltage device that is formed through conventional CMOS processing techniques. The device has a p-type gate and a p-type substrate region 705. Typically in CMOS, all of the gates in p-wells are n-type gates. By applying the appropriate implant masks, p-type gates can be made in p-well areas without any process changes. In the described embodiment, these CMOS techniques comprise sub 0.35 micron or sub 0.25 micron processing techniques. In more preferred embodiments, these techniques comprise 0.18 micron techniques, and more preferably 0.15 micron techniques. Accordingly, the storage structure has a gate dielectric layer thickness as described above.

The storage structure is programmed by destroying the gate dielectric layer so that a conductive path is formed between the storage structure's gate 706 and substrate region 705. This is done by exposing the gate's dielectric layer to a specific programming configuration, i.e. voltage application. In the illustrated example, a programming voltage $V_{pp}$ is applied to the storage structure sufficient to form a conductive path between the gate 706 and the substrate region 705. In the described embodiments, the programming voltage $V_{pp}$ is around 8 Volts. In this particular example, the conductive path that is formed extends between the gate 706 and substrate region 705 (as illustrated by the black path that exists in the lowermost of the substrate portions in FIG. 7). In the illustrated example, the storage structure can be programmed by either applying $V_{pp}$ to the substrate region 705 through contact 712 and grounding the gate 706, or, by applying a programming voltage $-V_{pp}$ on the gate 706 and grounding the substrate region 705 through the contact 712.

Figure 8:
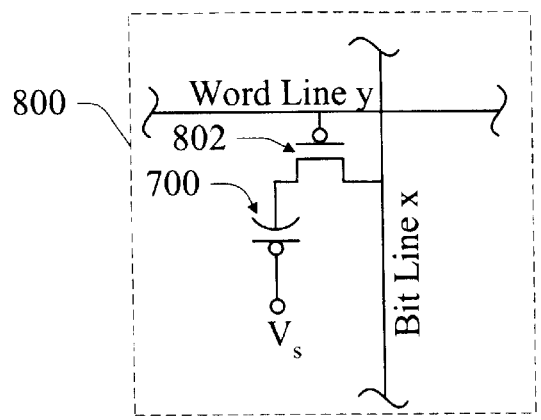
FIG. 8 is a schematic diagram of an exemplary memory cell structure in accordance with one embodiment of the present invention.

FIG. 8 shows an exemplary memory cell 800 that incorporates the storage structure 700 of FIG. 7. Memory cell 800 can be incorporated in the memory system 100 of FIG. 1. When so incorporated, memory cell 800 comprises each of the individual memory cells 102–132.

Memory cell 800 comprises a storage structure 700 that is modeled as a capacitor. In this example, the plates of the capacitor are provided by p-type gate 706 and substrate region 705. A high voltage p-channel transistor 802 is provided and has a pair of source/drain regions. The storage structure is programmed through the p-channel transistor 802.

In the illustrated example, the p-channel transistor has a gate dielectric layer thickness of around 70 Angstrom, a channel width of around 1 micron, and a channel length of around 0.6 micron. The well of the p-channel transistor 802 is coupled to receive a programming voltage $V_{pp}$. One of the pair of source/drain regions of p-channel transistor 802 is coupled with the gate 706 of the storage structure 700. The other of the pair of source/drain regions of the p-channel transistor 802 is coupled with bit line x, where x represents any of the bit lines 162–168 in FIG. 1. The gate of the p-channel transistor 802 is coupled with word line y, where y represents any of the word lines 142–148 in FIG. 1. In this example, the storage structure 700 is also read through the p-channel transistor 802.

The table set forth immediately below describes characteristics of the program and read modes for memory cell 800 when it is incorporated in a FPGA that is formed in accordance with 0.18 micron CMOS techniques. The p-type substrate of element 700 is tied to the pass gate. The substrate needs to be isolated from the other transistors. This can be done using either a triple well process or by having an n-type substrate with isolated p-wells.

|  | Addressed Row | Non-addressed Row | Addressed Column | Non-addressed column |
|---|---|---|---|---|
| Program Mode | 3.3 V | $V_{pp}$ | $V_{pp}$ | 3.3 V or float |
| Read Mode | 0 | 3.3 V | Connected to output buffer | Float |

Fourth Storage Structure Embodiment

Figure 9:
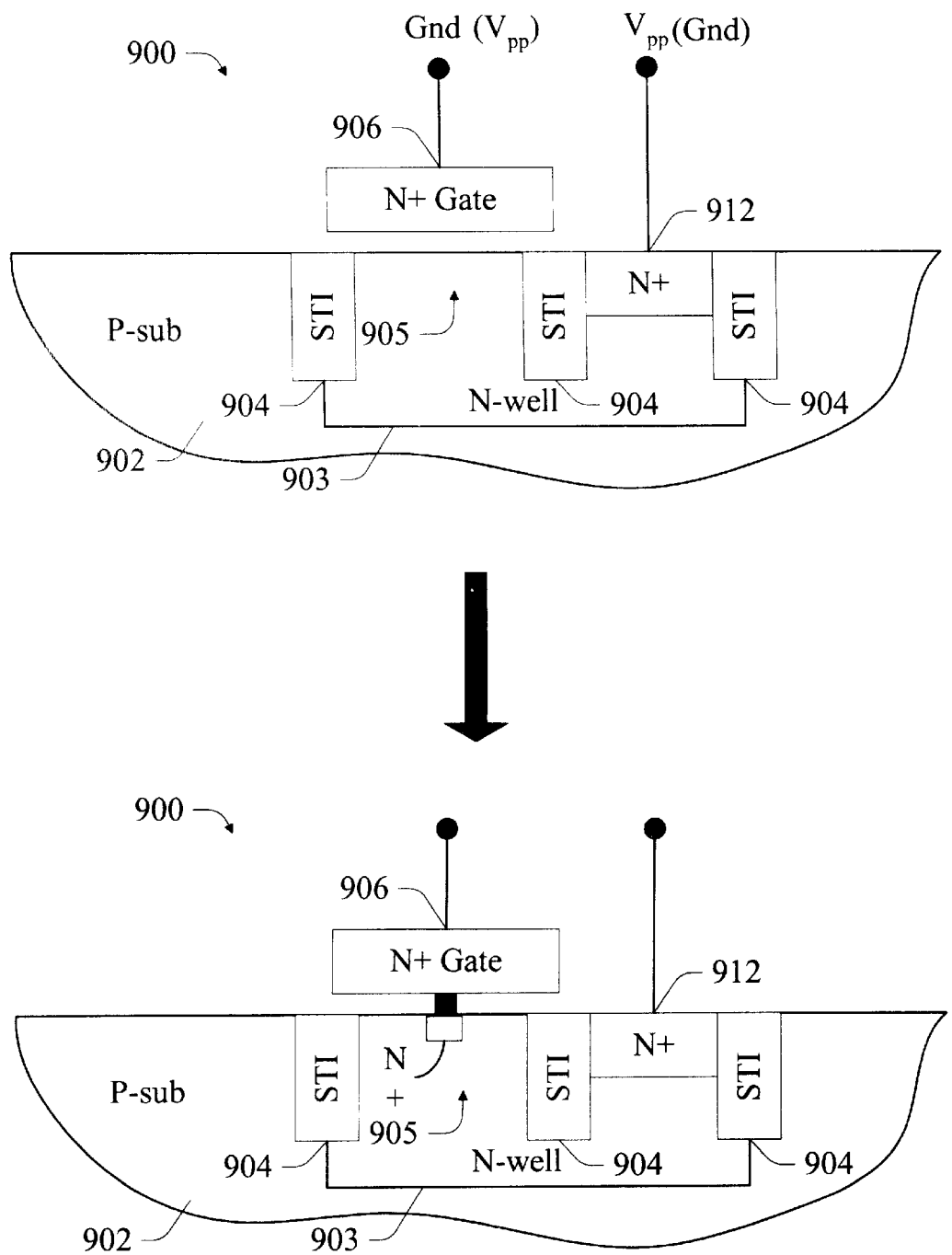
FIG. 9 is a diagrammatic side sectional view of a storage structure in accordance with one embodiment of the present invention.

FIG. 9 shows a storage structure in accordance with one embodiment generally at 900. This storage structure is preferably programmed to form a conductive link between similar type materials as will be described below. This, in turn, provides a low post-programming resistance which approximates a linear stable resistor. Programming the storage structure in this manner avoids any of the non-linearity issues that were previously associated with programmed cells having a conductive link between different types of materials, e.g. p-type and n-type.

A substrate 902 (which, in this example comprises a p-type substrate) comprises an n-type well 903 and a plurality of shallow trench isolation regions 904 formed therein through conventional techniques. A region 905 is provided proximate which a gate 906 is disposed. In this example, a portion of the gate 906 is disposed over substrate region 905. A gate dielectric (e.g. gate oxide) is formed intermediate gate 906 and a surface of substrate regions 905. A contact 912 to the substrate is provided in the form of an n-type region. In the illustrated example, the storage structure comprises a low voltage device that is formed through conventional CMOS processing techniques. The device has an n-type gate and an n-type substrate region 905. In the described embodiment, these CMOS techniques comprise sub 0.35 micron or sub 0.25 micron processing techniques. In more preferred embodiments, these techniques comprise 0.18 micron techniques, and more preferably 0.15 micron techniques. Accordingly, the storage structure has a gate dielectric layer thickness as described above.

The storage structure is programmed by destroying the gate dielectric layer so that a conductive path is formed between the storage structure's gate 906 and substrate region 905. This is done by exposing the gate's dielectric layer to a specific programming configuration, i.e. voltage application. In the illustrated example, a programming voltage $V_{pp}$ is applied to the storage structure sufficient to form a conductive path between the gate 906 and the substrate region 905. In the described embodiments, the programming voltage $V_{pp}$ is around 8 Volts. In this particular example, the conductive path that is formed extends between the gate 906 and substrate region 905 (as illustrated by the black path that exists in the lowermost of the substrate portions in FIG. 9). The conductive path that is formed in this example, is formed as a result of applying the programming voltage to the well 903 through contact 912, while grounding the gate 906. Alternately, the conductive path can be formed by applying the programming voltage to the gate and grounding the substrate through the contact 912. This enables the programming to take place in accumulation.

Figure 10A:
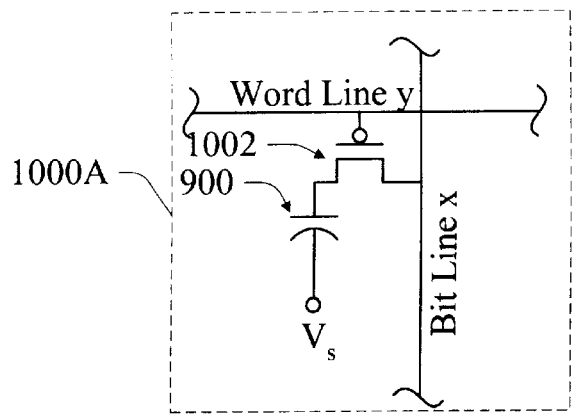
FIG. 10A is a schematic diagram of an exemplary memory cell structure in accordance with one embodiment of the present invention.
Figure 10B:
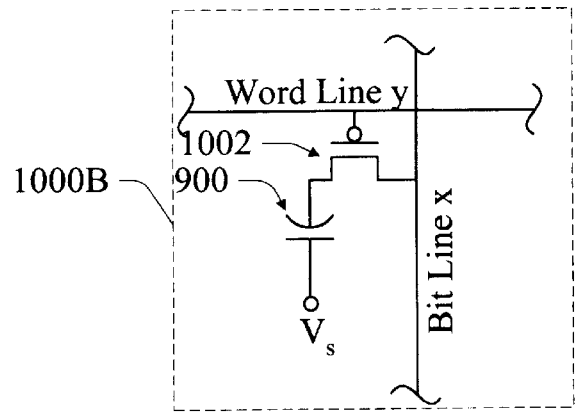
FIG. 10B is a schematic diagram of an exemplary memory cell structure in accordance with one embodiment of the present invention.

FIGS. 10A and 10B show exemplary memory cells 1000A and 1000B that incorporate the storage structure 900 of FIG. 9. The memory cells can be incorporated in the memory system 100 of FIG. 1. When so incorporated, memory cells 1000A, 1000B respectively comprise each of the individual memory cells 102–132.

Memory cells 1000A, 1000B comprise a storage structure 900 that is modeled as a capacitor. In this example, the plates of the capacitor are provided by n-type gate 906 and substrate region 905. A high voltage p-channel transistor 1002 is provided and has a pair of source/drain regions. The storage structure is programmed through the p-channel transistor 1002.

In the illustrated example, the p-channel transistor has a gate dielectric layer thickness of around 70 Angstrom, a channel width of around 1 micron, and a channel length of around 0.6 micron. The well of the p-channel transistor 1002 is coupled to receive a programming voltage $V_{pp}$. One of the pair of source/drain regions of p-channel transistor 1002 is coupled with the gate 906 of the storage structure. The other of the pair of source/drain regions of the p-channel transistor is coupled with bit line x, where x represents any of the bit lines 162–168 in FIG. 1. The gate of the p-channel transistor 1002 is coupled with word line y, where y represents any of the word lines 142–148 in FIG. 1. In this example, the storage structure 900 is also read through the p-channel transistor 1002. FIG. 10A shows the case where the storage structure 900 is programmed by applying the programming voltage to the gate while grounding the substrate. FIG. 10B, on the other hand, shows the case where the storage structure 900 is programmed by applying the programming voltage to the substrate while grounding the gate.

The table set forth immediately below describes characteristics of the program and read modes for memory cell 1000B when it is incorporated in a FPGA that is formed in accordance with 0.18 micron CMOS techniques as shown in FIG. 10B.

|  | Addressed Row | Non-addressed Row | Addressed Column | Non-addressed column |
|---|---|---|---|---|
| Program Mode | 3.3 V | $V_{pp}$ | $V_{pp}$ | 3.3 V or float |
| Read Mode | 0 | 3.3 V | Connected to output buffer | float |

Charge Pump Embodiments

In the embodiments described above, the programming voltage $V_{pp}$ can be provided by a circuit that is external to the integrated circuit chip that includes memory system 100. In various more preferred embodiments, however, the programming voltage $V_{pp}$ is provided by a charge pump circuit that is fabricated on the same integrated circuit chip as memory system 100. The charge pump is advantageously fabricated using CMOS devices that are compatible with standard sub 0.25 micron CMOS processes. Such processes include 0.18 micron and 0.15 micron processes. This is not, however, intended to limit application of the claims as pointed out above. This is much more advantageous that having a separate charge pump because it can enable users to program the memory array using simple logic signals. Otherwise, users might have to have a high voltage source available. The on-chip charge pump designs described below enable standard CMOS transistors to be utilized to provide the necessary programming voltage to program the storage structures. Advantageously, CMOS transistors that are configured to use a supply voltage of around 3.3 volts can be utilized to provide a programming voltage of up to 9 volts.

Figure 11:
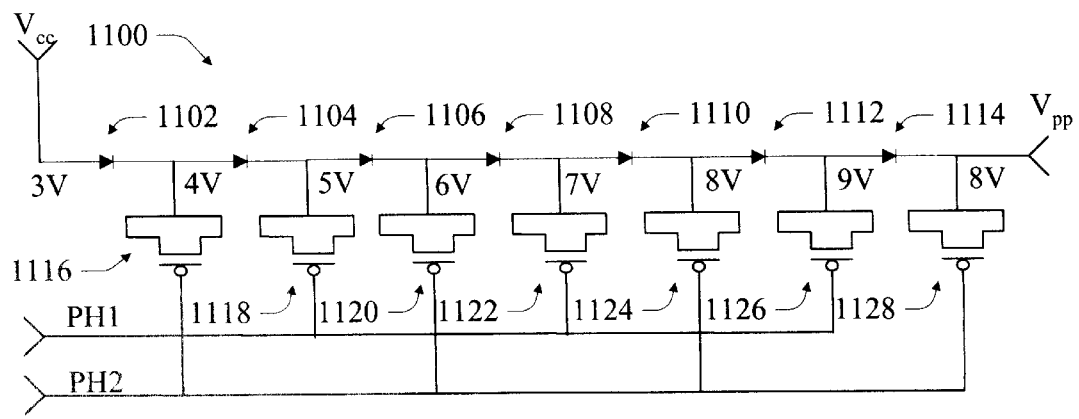
FIG. 11 is a schematic diagram of an exemplary charge pump circuit in accordance with one embodiment of the present invention.

FIG. 11 is a schematic diagram of a charge pump circuit 1100 in accordance with one embodiment. This design improves on the charge pump design described in application Ser. No. 09/262,981. In that design, the devices 1102 to 1114 were high voltage NMOS devices connected as diodes. The devices 1118 to 1128 were high voltage NMOS devices connected as capacitors. The process for those devices was chosen such that the breakdown voltage of the devices is more than $V_{pp}$, the high voltage output of the charge pump. To be able to generate high voltage using standard CMOS processes in the present embodiments, the charge pump is modified as follows: (1) p-diffusion to n-well diodes are used in the series path; (2) The I/O thick oxide PMOS devices are used as capacitors; and (3) in the latter stages of the charge pump, one capacitor is replaced by two capacitors in series (FIG. 12 embodiment), so that each of them "sees" only half of the voltage.

Charge pump circuit 1100 comprises individual diodes 1102–1114 and p-channel transistors 1116–1128. In the illustrated example, each of the diodes 1102–1114 comprise p-diffusion/n-well diodes. Each of the p-channel transistors 1116–1128 is a high voltage CMOS transistor having a gate dielectric (e.g. oxide) thickness and dimensions in accordance with the CMOS process that was utilized to form the transistor. In the figures, the voltage at each of the nodes in the series path between $V_{cc}$ and $V_{pp}$ is indicated.

The diodes are connected in series and define a path between a supply voltage of $V_{cc}$ and a programming voltage node designated as $V_{pp}$. The source/drain regions of each of the p-channel transistors 1116–1126 are commonly connected to a node that connects two of the series-connected diodes. The source/drain regions of p-channel transistor 1128 are commonly connected to the output node that defines $V_{pp}$. The gates of p-channel transistors 1118, 1122, and 1126 are coupled to a clock signal line PH1. The gates of p-channel transistors 1116, 1120, 1124, and 1128 are coupled to a clock signal line PH2. Clock signal line PH1 is coupled to receive a clock signal CLK, while clock signal line PH2 is coupled to receive a clock signal CLK# that is the inverse of the clock signal CLK.

P-channel transistors 1116–1128 are connected as capacitors. During a first half cycle of the clock signal CLK, p-channel transistors 1118, 1122, and 1126 charge, and p-channel transistors 1116, 1120, 1124, and 1128 discharge. During a second half cycle of the clock signal CLK, p-channel transistors 1118, 1122, and 1126 discharge, and p-channel transistors 1116, 1120, 1124, and 1128 charge. As a result, charge is pumped through the diodes 1102–1114 to the output node to provide the output voltage $V_{pp}$. This embodiment improves upon the charge pump embodiment disclosed in application Ser. No. 09/262,981 by eliminating gate breakdown issues that were associated with the use of n-channel transistors in the current path from $V_{cc}$ to $V_{pp}$.

Experience has demonstrated that the p-channel transistors at the end of the current path that is defined between the supply voltage and the programming voltage node, i.e. transistors 1124, 1126, and 1128, experience the highest gate-to-source (and gate-to-drain) voltages. In the past, this problem has been addressed by forming the transistors to have suitably high breakdown voltages so that the stress experienced by the transistors at the end of the line is not a factor. For example, transistor 1128 will typically have a breakdown voltage of around 11 volts and will experience a gate-to-source voltage of around 8 volts. Under these conditions, the transistor should not fail. This does not, however, mitigate the stress to which the transistors at the end of the line are subjected.

Figure 12:
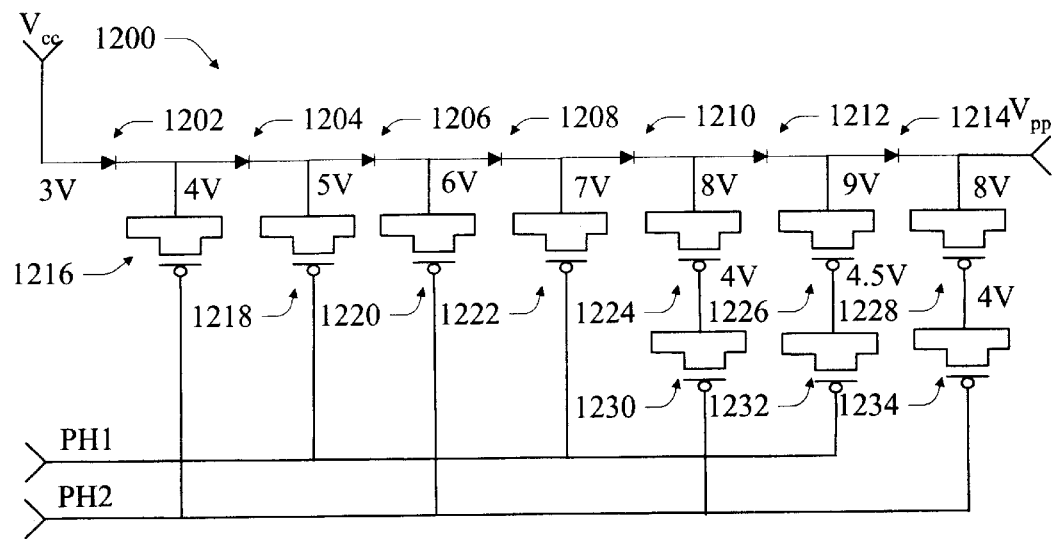
FIG. 12 is a schematic diagram of an exemplary charge pump circuit in accordance with one embodiment of the present invention.

FIG. 12 is a schematic diagram of a charge pump circuit 1200 in accordance with one embodiment that reduces the stresses that are experienced by the transistors at the end of the line. The charge pump circuit is similar in many respects to the FIG. 11 charge pump circuit. Charge pump circuit 1200 comprises individual diodes 1202–1214 and p-channel transistors 1216–1228. In the illustrated example, each of the diodes 1202–1214 comprise p-diffusion/n-well diodes. Each of the p-channel transistors 1216–1228 is a high voltage CMOS transistor having a gate dielectric (e.g. oxide) thickness and dimensions that are consistent with the CMOS process that was utilized to form the transistor.

The diodes are connected in series and define a path between a supply voltage of $V_{cc}$ and a programming voltage node designated as $V_{pp}$. The source/drain regions of each of the p-channel transistors 1216–1226 are commonly connected to a node that connects two of the series-connected diodes. The source/drain regions of p-channel transistor 1228 are commonly connected to the output node that defines $V_{pp}$. In addition, at least one of the p-channel transistors has at least one other p-channel transistor connected in series between it and a clock signal line. In this particular example, three additional p-channel transistors are provided, each of which being connected in series with a respective one of transistors 1224, 1226, and 1228. Specifically, a p-channel transistor 1230 has its source and drain regions commonly connected to the gate of p-channel transistor 1124; p-channel transistor 1232 has its source and drain regions commonly connected to the gate of p-channel transistor 1226, and p-channel transistor 1234 has its source and drain regions commonly connected to the gate of p-channel transistor 1128.

In this example, the gates of p-channel transistors 1218, 1222, and 1232 are coupled to a clock signal line PH1. The gates of p-channel transistors 1216, 1220, 1230, and 1234 are coupled to a clock signal line PH2. Clock signal line PH1 is coupled to receive a clock signal CLK, while clock signal line PH2 is coupled to receive a clock signal CLK# that is the inverse of the clock signal CLK.

P-channel transistors 1216–1234 are connected as capacitors. During a first half cycle of the clock signal CLK, p-channel transistors 1218, 1222, and 1226/1232 charge, and p-channel transistors 1216, 1220, 1224/1230, and 1228/1234 discharge. During a second half cycle of the clock signal CLK, p-channel transistors 1218, 1222, and 1226/1232 discharge, and p-channel transistors 1216, 1220, 1224/1230, and 1228/1234 charge. As a result, charge is pumped through the diodes 1202–1214 to the output node to provide the output voltage $V_{pp}$. This embodiment improves upon the charge pump embodiment discussed above in that stresses that are experienced by the end-of-the-line transistors are reduced greatly by the series connection of another p-channel transistor.

The charge pumps described above are preferably fabricated on the same chip with, and using the same known CMOS processing techniques that are utilized to form the non-volatile storage devices described above. The charge pump advantageously enables transistors that are configured for use with a supply voltage of 3.3 volts to be utilized to provide a programming voltage as high as 9 volts (at as much as 310 microamperes in one embodiment). This is a fundamental advancement and greatly enhances the overall convenience of the memory system.

$I_{read}$ for Different Programmed Memory Cells

Figure 13:
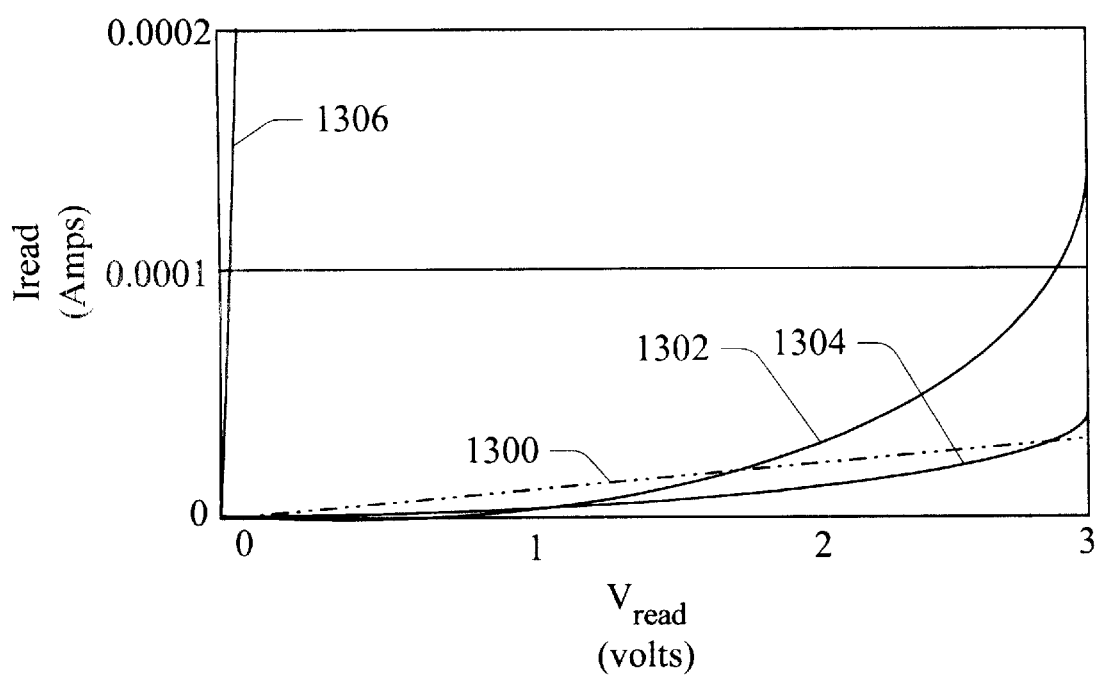
FIG. 13 is a graph of $I_{read}$ for different programmed memory cells.

FIG. 13 is a graph that describes the reading current for different programmed memory cells. The line 1300 represents a desired specification above which it is desired to operate. Line 1302 represents a memory cell that has been programmed with a 100 micro amp current to form a conductive path between a n-type gate and a p-type well. Line 1304 represents a memory cell that has been programmed with a 1.0 milliamp current to form a conductive path between a n-type gate and a p-type well. Line 1306 represents a memory cell that has been programmed with a programming current of 100 micro amps to form a conductive path between an n-type gate and an n-type drain. It is desirable to utilize a programming current that is 100 micro amps or less. This is highly desirable because it allows that programming circuitry, and in particular the charge pump, to be located "on chip" with the memory array. Yet, for the given programming current, line 1304 is well below the desirable specification at a read voltage of 1.8 volts. It is possible to boost the programming current to 1 milli amp so that line 1304 is shifted upward to line 1302 thereby bringing the device to within desired specifications for reading, e.g. 1.8 volts. Yet, by doing so, all of the advantages of having an "on chip" charge pump are lost because now an external voltage source must be used.

As can be seen from line 1306 (corresponding to the structures shown in FIGS. 2 and 3), the characteristics of the device place it desirably above the specification line 1300 for read voltages of 1.8 volts and below. Thus, the "on chip" charge pump can be utilized.

Figure 14A:
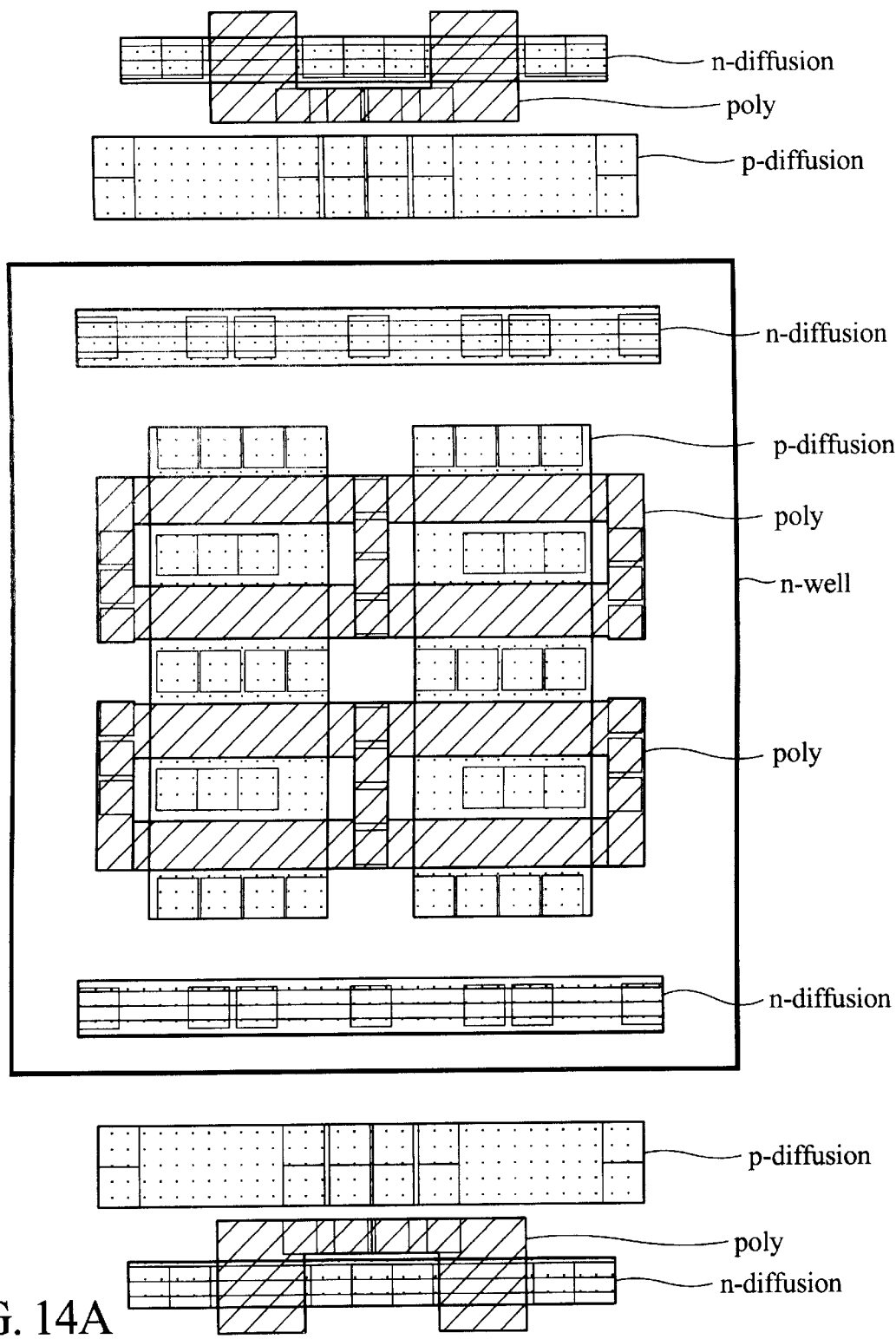
FIG. 14A is a layout drawing that shows the n-diffusion, p-diffusion, polysilicon, and n-well layers of a memory cell 102 according to the invention.

FIG. 14A is a layout drawing that shows the n-diffusion, p-diffusion, polysilicon, and n-well layers of a memory cell 102 according to an embodiment of the invention.

Figure 14B:
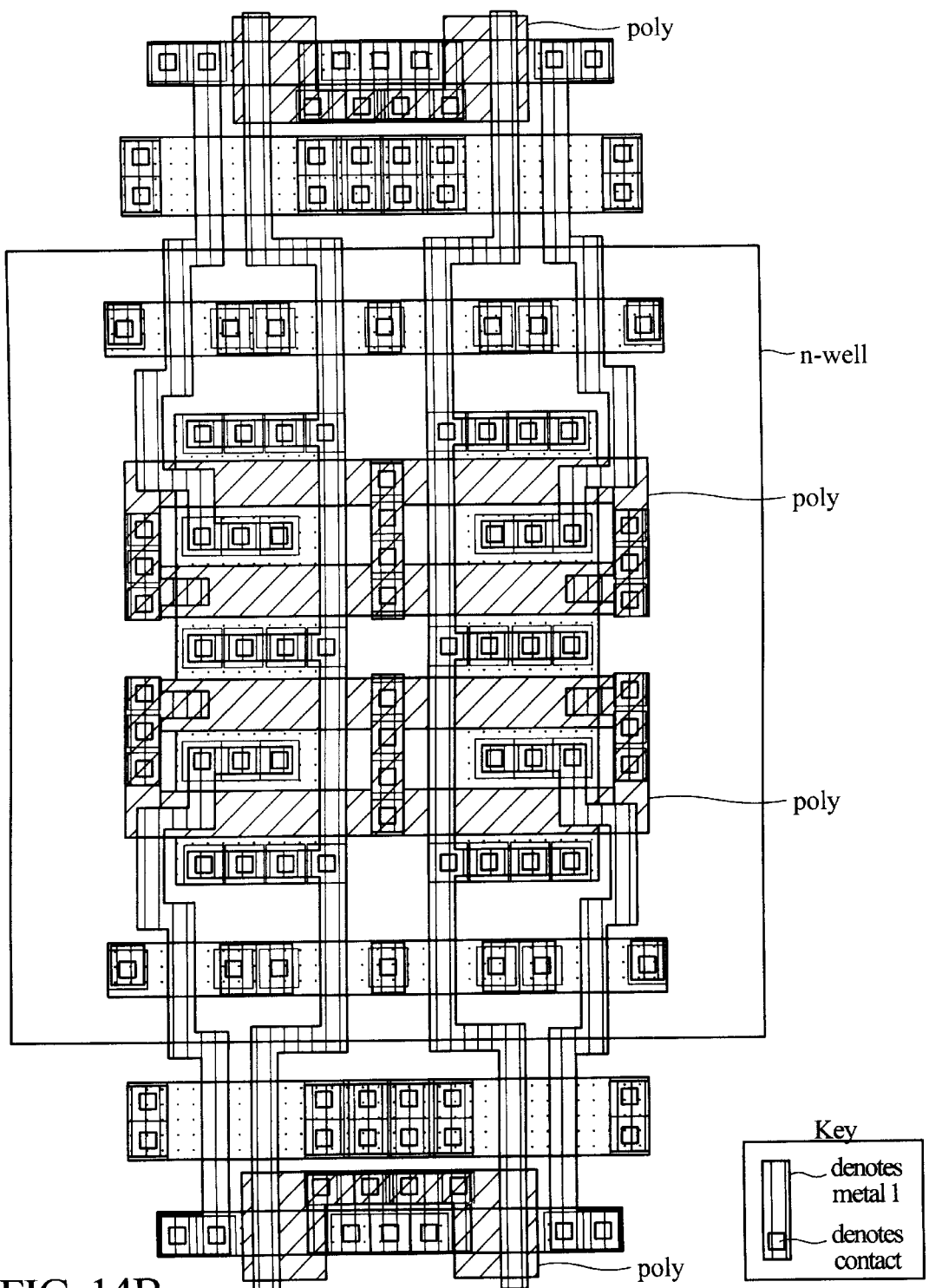
FIG. 14B shows the layout drawing of FIG. 14A further including the first metal layer and contacts.

FIG. 14B shows the layout drawing of FIG. 14A further including the first metal layer and contacts.

CONCLUSION

Various embodiments described above greatly improve the structures and method that are utilized in connection with semiconductor memory circuitry, and in particular non-volatile memory. In the described embodiments, standard unmodified CMOS processing techniques can be utilized to form the components of the memory circuitry. In embodiments where the charge pump is located on-chip, limitations on programming current (i.e. limited to 100 microamps) can be complied with. Further, voltage magnitudes utilized for reading the memory cells can comply with that which is necessary for operating with deep submicron technology (e.g. 1.8 Volts and below). Further, the "on" resistance at these reading voltages is typically less than 100 kOhm. Thus, this ensures reliable sensing between "on" and "off" states. The various embodiments discussed above can be utilized in a number of different applications that will be apparent to those of skill in the art. One such application utilizes non-volatile memory to implement a re-routing function in connection with so-called built-in self-repair (BISR) circuitry that is described in detail in application Ser. No. 09/262,981.

In accordance with some embodiments of the invention, the non-volatile memory structures described above are used in a programmable logic device (for example, an FPGA) to store the encryption keys in an encryption circuit described by Parlour and Ballantyne in related U.S. patent application Ser. No. 09/524,971. The subject matter of U.S. patent application Ser. No. 09/524,971, including the description of the encryption circuit hardware and its operation, is incorporated herein by reference.

In some embodiments, an integrated circuit (for example, an FPGA) fabricated utilizing standard CMOS processing includes a core of lower voltage logic transistors (for example, 1.5 volt logic level transistors) and a surrounding ring of higher voltage I/O circuitry utilizing higher voltage transistors (for example, 3.3 volt logic level transistors). The above-described transistors in the charge pump used to realize the necessary charge pump capacitances are made in the same way that the higher voltage I/O transistors are made, whereas the above-described cell structures that are programmed are made in the same way that the core transistors are made.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A method of programming a non-volatile memory cell comprising:

providing a storage structure supported on a substrate, the storage structure being part of the non-volatile memory cell, the storage structure having a gate and a substrate region, the substrate region being disposed beneath the gate and within the substrate, an intervening dielectric layer being disposed between the substrate region and the gate; and applying a programming voltage to the storage structure sufficient to form a permanent conductive path between the gate and the substrate region.

2. The method of claim 1, wherein the gate and the substrate region are of a same conductivity type.

3. The method of claim 1, wherein the step of applying a programming voltage causes the conductive path to extend through the dielectric layer to a portion of the substrate region, and causes the portion of the substrate region to be more highly doped after the forming of the conductive path than before the forming of the conductive path.

4. The method of claim 3, wherein the step of applying the programming voltage results in the conductive path having a post-programming resistance substantially constant over a range of voltages.

5. The method of claim 1, wherein the substrate region is a portion of an a N-well, and wherein the substrate is of a P conductivity type.

6. The method of claim 1, further comprising: providing a charge pump circuit integrated into the substrate, the charge pump circuit outputting the programming voltage.

7. The method of claim 1, further comprising:

providing a means for producing a programming voltage, the means for producing a programming voltage being integrated into the substrate, the means for producing a programming voltage outputting the programming voltage.

8. The method of claim 1, further comprising: providing an access transistor, the access transistor supplying a programming current to the storage structure, the programming current flowing through the storage structure such that the conductive path is formed.

9. The method of claim 1, further comprising: supplying a programming current to the storage structure, the programming current flowing through the storage structure such that the conductive path is formed.

10. An integrated circuit comprising:

a non-volatile memory cell including a storage structure supported on a substrate, the storage structure having a gate and a substrate region, the substrate region being disposed beneath the gate and within the substrate, the non-volatile memory cell further including an intervening dielectric layer being disposed between the substrate region and the gate;

means for applying a programming voltage to the storage structure sufficient to form a permanent conductive path between the gate and the substrate region; and a core of lower voltage logic transistors surrounded by a ring of higher voltage I/O circuitry, the intervening dielectric layer of the storage structure being of a first thickness, each lower voltage logic transistor of the core having a gate dielectric of a second thickness, the first thickness being substantially equal to the second thickness.

11. The integrated circuit of claim 10, wherein the non-volatile memory cell stores a part of an encryption key.

12. The integrated circuit of claim 10, wherein the non-volatile memory cell is part of a programmable logic device.

13. The integrated circuit of claim 10, wherein the non-volatile memory cell is part of a field programmable gate array.

14. A field programmable gate array (FPGA) comprising:

a substrate;

a plurality of word lines supported by the substrate;

a plurality of bit lines supported by the substrate; and a plurality of memory cells supported by the substrate, each memory cell comprising:

a low voltage CMOS storage structure having a gate, a gate dielectric, and a substrate region, the memory cell being configured for programming by rupturing the gate dielectric of the low voltage CMOS storage structure; and a high voltage p-channel transistor having a gate and a pair of source/drain regions, one of the pair of source/drain regions of the p-channel transistor being coupled to the low voltage CMOS storage structure, the other of the pair of source/drain regions of the p-channel transistor being coupled to one of the plurality of bit lines, the gate of the p-channel transistor being coupled to one of the plurality of word lines, wherein the low voltage CMOS storage structure is configured for programming through the p-channel transistor.

15. The field programmable gate array of claim 14, wherein said one of the pair of source/drain regions of the p-channel transistor is coupled to the gate of the low voltage CMOS storage structure.

16. The field programmable gate array of claim 14, wherein the gate of the low voltage CMOS storage structure comprises polysilicon of a P conductivity type, wherein the substrate region of the low voltage CMOS storage structure is of the P conductivity type, wherein the high-voltage p-channel transistor has a gate dielectric, the gate dielectric of the high-voltage p-channel transistor being thicker than the gate dielectric of the low voltage CMOS storage structure.

17. The field programmable gate array of claim 14, wherein the memory cells are disposed in rows and columns, the field programmable gate array further comprising:
a plurality of source voltage lines supported by the substrate, a first of the plurality of source voltage lines being coupled to the substrate region of the low voltage CMOS storage structure of each of the memory cells of a first of the rows, a second of the plurality of source voltage lines being coupled to the substrate region of the low voltage CMOS storage structure of each of the memory cells of a second of the rows.

18. The field programmable gate array of claim 17, further comprising:
word line control circuitry coupled to the first and second source voltage lines, the word line control circuitry placing a first voltage on the first source voltage line and a second voltage on the second source voltage line if any memory cell of the first row of memory cells is selected for reading, the word line control circuitry placing the second voltage on the first source voltage line and the first voltage on the second source voltage line if any memory cell of the second row of memory cells is selected for reading.

19. The field programmable gate array of claim 18, wherein the first voltage is approximately zero volts, and wherein the second voltage is approximately 3.3 volts.

20. The field programmable gate array of claim 14, wherein each of the memory cells further comprises a contact to the substrate.

21. The field programmable gate array of claim 20, wherein the contact comprises a P+ conductivity type region disposed in the substrate, the P+ conductivity type region being separated from the substrate region by a trench isolation structure.

22. The field programmable gate array of claim 14, wherein the field programmable gate array comprises:
an on-chip charge pump that generates a programming voltage, the programming voltage being usable to program selected ones of the plurality of memory cells.

23. A field programmable gate array (FPGA) comprising:
a core comprising a plurality of word lines, a plurality of bit lines, a plurality of source voltage lines, and an array of memory cells, each memory cell including an access field effect transistor and a low voltage storage structure, the access field effect transistor having a gate that is connected to one of the plurality of word lines, the access field effect transistor having a first source/drain region that is connected to one of the bit lines, the low voltage storage structure having an N-type substrate region and an N-type gate, the access field effect transistor having a second source/drain region that is coupled to the gate of the low voltage storage structure, the substrate region of the low voltage storage structure being coupled to one of the plurality of source voltage lines, the low voltage storage structure having a gate dielectric of a first thickness;
a ring of high voltage I/O circuitry that includes high voltage field effect transistors, each of the high voltage field effect transistors having a gate dielectric of a second thickness, the second thickness being greater than the first thickness; and
an on-chip charge pump comprising transistors connected as charge pump capacitors, each transistor that is connected as a charge pump capacitor having a gate dielectric of the second thickness, the charge pump generating a programming voltage that programs a selected one of the memory cells by rupturing the gate dielectric of the low voltage storage structure of the selected memory cell such that a conductive path is formed between the N-type gate of the low voltage storage structure and the substrate region of the low voltage storage structure.

* * * * *